United States Patent
Hulbert et al.

(10) Patent No.: US 8,324,901 B2
(45) Date of Patent: Dec. 4, 2012

(54) UPCONVERTER

(75) Inventors: Anthony Peter Hulbert, Southampton (GB); John Hunt, Southampton (GB)

(73) Assignee: Siemens Aktiengesellschaft, Munich (DE)

( * ) Notice: Subject to any disclaimer, the term of this patent is extended or adjusted under 35 U.S.C. 154(b) by 431 days.

(21) Appl. No.: 12/753,134

(22) Filed: Apr. 2, 2010

(65) Prior Publication Data
US 2010/0253354 A1   Oct. 7, 2010

(30) Foreign Application Priority Data

Apr. 3, 2009 (GB) .................................. 0905753.0
Sep. 8, 2009 (GB) .................................. 0915649.8

(51) Int. Cl.
*G01V 3/00* (2006.01)

(52) U.S. Cl. ........................................................ 324/322

(58) Field of Classification Search ........... 324/300–322
See application file for complete search history.

(56) References Cited

U.S. PATENT DOCUMENTS

| | | | |
|---|---|---|---|
| 3,611,110 A | 10/1971 | Corbey | |
| 3,824,482 A | 7/1974 | Whelehan, Jr. | |
| 5,245,288 A | 9/1993 | Leussler | |
| 5,254,950 A * | 10/1993 | Fan et al. ....................... | 324/322 |
| 5,384,536 A | 1/1995 | Murakami et al. | |
| 5,461,314 A * | 10/1995 | Arakawa et al. ............... | 324/318 |
| 5,483,158 A * | 1/1996 | van Heteren et al. .......... | 324/318 |
| 5,533,011 A * | 7/1996 | Dean et al. ..................... | 370/342 |
| 5,565,779 A * | 10/1996 | Arakawa et al. ............... | 324/318 |
| 6,906,520 B2 | 6/2005 | Heid et al. | |
| 7,123,009 B1 | 10/2006 | Scott | |
| 7,323,876 B2 | 1/2008 | Den Boef | |
| 7,417,433 B2 | 8/2008 | Heid et al. | |
| 7,622,928 B2 | 11/2009 | Gauss et al. | |
| 7,701,220 B2 | 4/2010 | Ehnholm | |
| 7,750,630 B2 | 7/2010 | Van Helvoort et al. | |
| 7,750,635 B2 | 7/2010 | Van Helvoort et al. | |
| 7,777,492 B2 | 8/2010 | Vernickel et al. | |
| 8,138,761 B2 * | 3/2012 | Evans ............................ | 324/318 |
| 8,217,651 B2 * | 7/2012 | Wiesinger et al. ............ | 324/309 |
| 2003/0206019 A1 | 11/2003 | Boskamp | |
| 2007/0013376 A1 | 1/2007 | Heid et al. | |
| 2007/0188175 A1 | 8/2007 | Burdick, Jr. et al. | |
| 2007/0207763 A1 | 9/2007 | Bollenbeck et al. | |
| 2008/0157769 A1 | 7/2008 | Renz et al. | |

(Continued)

FOREIGN PATENT DOCUMENTS

GB   1132545   1/1967

OTHER PUBLICATIONS

U.S. Appl. No. 12/874,706, filed Sep. 2, 2010.

(Continued)

*Primary Examiner* — Dixomara Vargas
(74) *Attorney, Agent, or Firm* — Schiff Hardin LLP

(57) ABSTRACT

An upconverter has a low noise amplifier, a two port mixer and an antenna. The two port mixer comprises a first port to receive from the low noise amplifier an amplified input signal to be upconverted and a second port to receive a local oscillator signal and to output the amplified, upconverted signal at upper and lower sideband frequencies. The low noise amplifier is coupled to the first port; and the antenna is coupled to the second port.

14 Claims, 5 Drawing Sheets

U.S. PATENT DOCUMENTS

| | | | |
|---|---|---|---|
| 2008/0246477 A1 | 10/2008 | Nakabayashi | |
| 2009/0286478 A1 | 11/2009 | Biber et al. | |
| 2010/0001724 A1* | 1/2010 | Bashirullah | 324/307 |
| 2010/0253353 A1* | 10/2010 | Cork et al. | 324/318 |

OTHER PUBLICATIONS

U.S. Appl. No. 12/726,567, filed Mar. 18, 2010.
U.S. Appl. No. 12/753,159, filed Apr. 2, 2010.
U.S. Appl. No. 12/753,132, filed Apr. 2, 2010.
U.S. Appl. No. 12/753,150, filed Apr. 2, 2010.
U.S. Appl. No. 12/753,148, filed Apr. 2, 2010.
U.S. Appl. No. 12/753,138, filed Apr. 2, 2010.
"Behavioral Modeling and Simulation of a Parametric Power Amplifier," Gray et al., IMS (2009) pp. 1373-1376.

* cited by examiner

UPCONVERTER

BACKGROUND OF THE INVENTION

1. Field of the Invention

The present invention relates to an upconverter, in particular for use in magnetic resonance imaging (MRI) systems.

2. Description of the Prior Art and Related Subject Matter

MRI scanners use a combination of a strong constant magnetic field (B0) from a superconducting magnet which is modified by gradient fields generated by gradient coils, together with a rotating magnetic field (B1) from a radio frequency (RF) antenna to excite nuclear magnetic resonances in the body that generate short term RF signals that are received to build up a tomographic image.

All current-generation MRI scanners employ arrays of local coils mounted in close proximity to the scanned patient to receive the RF with maximum possible signal to noise ratio (SNR). The local coils that receive signals from the back of the patient are mounted in the patient table. Local coils that receive signals from the front of the patient are arranged into 'mats' that are carefully placed over the patient. Associated with each mat is a flexible cable typically containing one co-axial line for each local coil. The cables interact with the B1 field and with the signals generated from the patient so 'traps' (high impedance sections) must be included at regular (typically λ/8) intervals. These add cost and inconvenience to the structure. In use, the requirement to connect the cables and sterilize them between scanning one patient and the next leads to down-time between scans. Elimination of these cables is therefore desirable.

In co-pending Patent Application No. 0903722.7, corresponding to U.S. Ser. No. 12/612,831 filed Nov. 5, 2009, a wireless MRI system is described in which an array of antennas lining the MRI scanner bore is arranged to transmit a local oscillator (LO) signal that is received by antennas on the patient mat and fed therefrom to upconverters which upconvert magnetic resonance signals received from local coils in the patient mat and re-radiate them from the same antenna to be received at one or more of the bore array antennas for downconversion and processing to generate an MRI image. When using a wireless implementation, it is desirable that the upconverter is entirely powered by an incident local oscillator signal at a microwave frequency.

SUMMARY OF THE INVENTION

In accordance with a first aspect of the present invention, an upconverter has a low noise amplifier, a two port mixer and an antenna, wherein the two port mixer includes a first port to receive from the low noise amplifier an amplified input signal to be upconverted and a second port to receive a local oscillator signal and to output the amplified, upconverted signal at upper and lower sideband frequencies; wherein the low noise amplifier is coupled to the first port, and the antenna is coupled to the second port.

Using a two port mixer with a common IF/LO port connected to an antenna and a signal input port, enables a reduction in cost and complexity over a conventional three port arrangement, as only a single antenna, with associated components, is required.

Preferably, the local oscillator signal has a frequency at least twice that of the input signal.

Preferably, the upconverter further has a power harvester for harvesting power from the local oscillator signal.

Preferably, the power harvester provides a DC voltage supply to the low noise amplifier.

Preferably, the power harvester includes a Cockcroft Walton multiplier.

Preferably, the power harvester includes an impedance circuit to increase the available RF voltage from the local oscillator prior to rectification to DC.

Preferably, the upconverter further has a power splitter coupled between the second port of the mixer and the antenna.

Preferably, the power splitter splits incident local oscillator power between two outputs, one output being connected to the power harvester and the other output being connected to the second port of the mixer.

Preferably, the power splitter has one of a directional coupler and a Wilkinson coupler.

Preferably, the first port is an RF port, which receives signals in the frequency range 20 MHz to 500 MHz.

Preferably, the second port is a microwave port, which receives signals in the frequency range 1 GHz to 5 GHz.

In accordance with a second aspect of the present invention, a wireless magnetic resonance imaging system has a local oscillator and transceiver array mounted on or downstream of a bore tube of the system; and a wireless local coil array and upconversion stage having a number of upconverters according to the first aspect.

DESCRIPTION OF THE PREFERRED EMBODIMENTS

The wireless concept to which the features of the present invention apply is based on upconversion, in the patient mat, of the RF (Larmor) frequency signals from the patient coils to microwave frequencies for transmission to microwave antennas located on the bore of the scanner. The combination of transmit and receive antennas on the patient and bore respectively constitutes a MIMO (Multiple Input/Multiple Output) system. The greater multiplicity of receive antennas in the bore array allows individual signals from a plurality of patient antennas to be resolved. The present invention relates to an implementation of the upconversion process.

Figure 1:
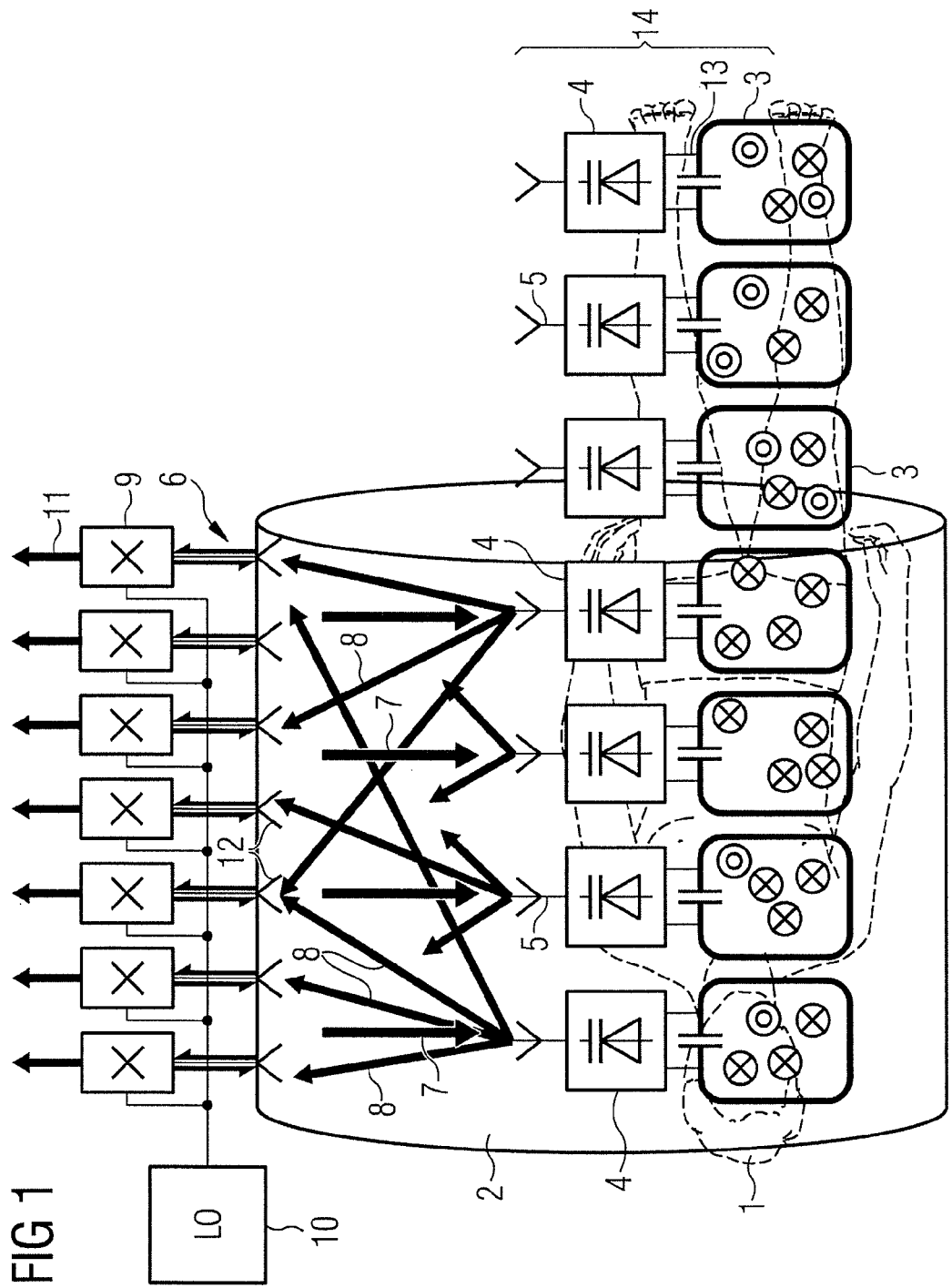
FIG. 1 illustrates an example of an MRI system incorporating upconverters according to the present invention.

An example of an MRI system using a MIMO microwave link, in which upconverters in accordance with the present invention are used, will now be described. FIG. 1 shows a patient 1 within an MRI scanner bore tube 2. A mat covers the part of the patient for imaging and embedded in the mat are a plurality of local coils 3. Associated with each local coil 3 is an upconverter stage 4 and microwave antenna 5. Transceivers 9, connected to an array 6 of antennas 12, are integrated into the scanner bore 2. The frequency upconverter 4 for each patient mat coil 3 produces signals for transmission to the array of transceivers in the scanner bore 2. A local oscillator (LO) signal at around 2.4 GHz, or other chosen microwave frequency, feeds the antenna array 6 to illuminate the patient coil electronics 14 with a signal 7 at the local oscillator frequency. The upconverters in the upconverter stage 4 use the incident local oscillator signal 7 to provide a frequency reference and power for upconversion. Magnetic resonance (MR) signals 13 from the coils are thereby converted to microwave frequency signal 8 and transmitted to the bore transceiver antenna array 6. The same local oscillator signal in the transceivers converts the upconverted signals 8, from the patient coils 3, at the LO frequency ±63 MHz, back to the original MR frequency of 63 MHz for input 11 to MR receivers in an image processing system (not shown.) The Larmor frequency $\omega 0$ is dependent upon the gyromagnetic ratio $\gamma$ and the magnetic field strength B0, so in the case of a 1.5 Tesla magnet, the MR frequency is 63.6 MHz, or for a 3 T magnet, the MR frequency is 123 MHz. These values are commonly used magnet and MR frequencies, but magnets ranging from 0.5 T to 11 T could be used and the MR and local oscillator microwave frequencies may also be chosen from a much wider band. For example, dependent upon the nucleus type, the MR frequencies may range from 20 MHz to 500 MHz and the LO frequency might be chosen in the range of 1 GHz to 5 GHz.

A conventional mixer has three ports: radio frequency (RF), local oscillator (LO) and intermediate frequency (IF). In normal operation, a conventional mixer operates as follows: a high level local oscillator is connected to the LO port; a lower level signal is connected to the RF port. The operation of the mixer creates mixing products at frequencies equal to the LO frequency plus and minus the RF frequency. These mixing products appear at the IF port. Conventional mixers are standard components that are well known and understood in the art.

However, for wireless MRI systems, there is a need to minimize the size and complexity of components, given the limited amount of space available and the desire to improve the experience for the patient. Thus, the present invention, provides an upconverter based on a two port mixer and a low noise amplifier. A first port of the upconverter receives an input signal at a relatively low frequency to be upconverted and amplified and a second port both receives the local oscillator signal at a relatively high frequency and outputs the relatively high frequency upconverted and amplified mixing product.

Another desirable feature in a wireless system is to avoid the need for external power sources. Therefore, the upconverter may be provided with a power harvester, so that the upconverter can be powered using power harvested from the local oscillator signal. The local oscillator 7 is transmitted from an antenna or array of microwave antennas in the bore 2 and is received by the microwave antenna 5 of the upconverter.

Figure 2:
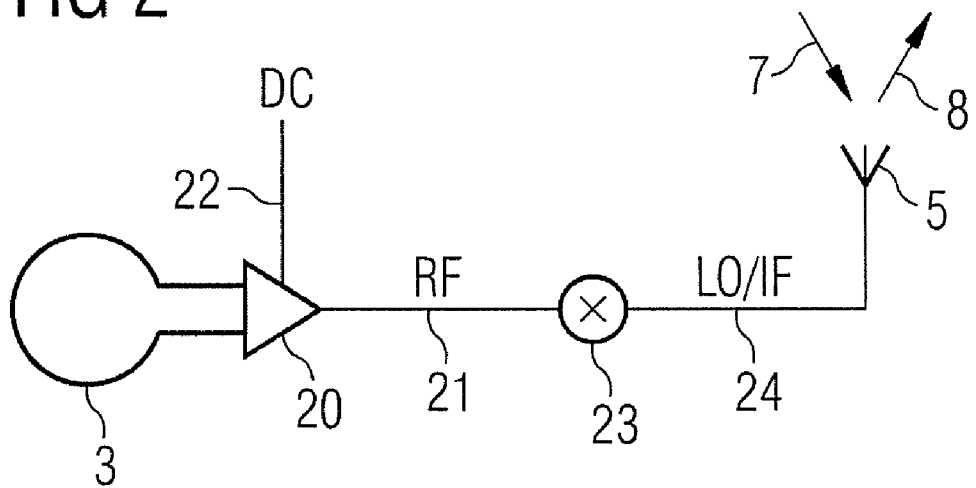
FIG. 2 illustrates in more detail, an example of an upconverter according to the present invention, for use in the system of FIG. 1.

A first configuration of an upconverter is shown in FIG. 2. A pick up coil 3 of the local coil array is excited by magnetic resonance signals from the patient 1 at the Larmor frequency and an MR signal 13, so generated, is input to a low noise amplifier 20. A DC voltage 22 powers the low noise amplifier. The DC supply to power the amplifier may be provided by a battery or super capacitor that is charged at regular intervals. The input RF signal 13 is amplified and the amplified signal is passed to a first port 21 of a two port mixer 23. A radiated local oscillator (LO) signal 7 from the microwave antennas 12 mounted on the bore tube 2 is received at the microwave antenna 5 connected to a second local oscillator/intermediate frequency port 24 of the mixer. The RF signal 13 and LO signal 7 are mixed in the mixer 23 to produce upper and lower sidebands and provide further amplification as necessary, so that the radio frequency signal 13 received from each of the local coils 3 is upconverted. The upconverted signal including the sidebands is still within the bandwidth of the bore tube microwave antenna 12 and one, other, or both of the sidebands are radiated for reception by receivers 9, which may be in the bore, or downstream of the bore, where and the receivers process the signals into magnetic resonance images.

The amplified, upconverted signal is output at the same port 24 as received the LO signal, where the LO and IF ports have been combined to a single port. The radio frequency signal and local oscillator signal combine to produce upper and lower sidebands which are still within the bandwidth of microwave antenna 5, then one or both sidebands are re-radiated for reception by the receivers 9, the signals are processed to form magnetic resonance images.

Figure 3:
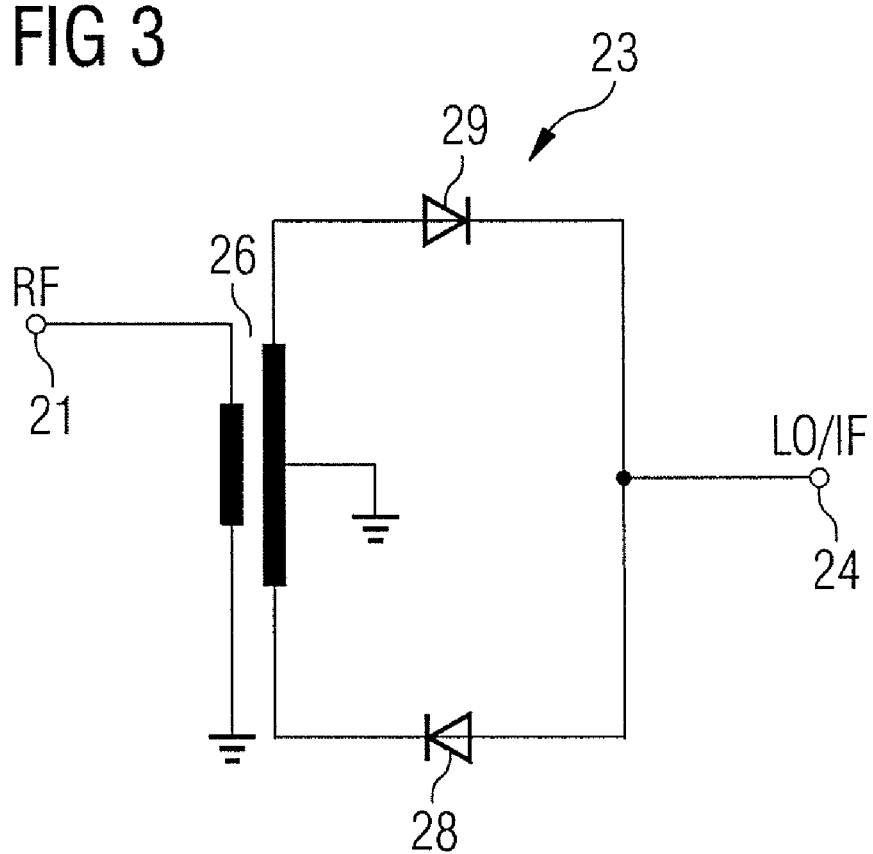
FIG. 3 shows an implementation of a two port mixer for use in the upconverter of FIG. 2.

An example of an implementation of a two port mixer 23 is shown in FIG. 3. A transformer 26 and diodes 27, 28 form the two port mixer 23. The arrangement of the diodes determines the direction of the current flow for the input LO signal 7 and output IF 8 respectively. The transformer may be implemented with trifilar wire in a resonant circuit to avoid the need to use a ferrite core, which is essential for operation inside the powerful magnet of an MRI scanner.

The RF port 21 of the two port mixer 23 is connected to the output of the low noise amplifier 20. In turn, the amplifier 20 is driven by the signal 13 received from the pick-up coil arranged on the patient in an MRI scanner. Thus the operation of the circuit can be seen to be that a signal received by a pick-up coil is amplified by the low noise amplifier and upconverted by the two port mixer. The upconverted signal passes through the LO/IF port of the two port mixer in its IF port role, whence it is connected to an antenna for transmission of the upconverted signal sidebands.

However, it is also desirable that the amplifier 20 is fully powered by the incident local oscillator signal, so no external DC power source is required. 2007/0013376 describes an example in which a parametric amplifier is used to amplify and upconvert a signal received on a pick-up coil in an MRI scanner, feeding the signal to a microwave antenna for transmission to antennas lining the bore of the scanner and powering the parametric amplifier by harvesting from a local oscillator signal transmitted from the antennas lining the bore of the scanner.

As a further aspect of this invention, the amplifier may be powered using power harvested from the local oscillator. Thus, the microwave antenna of the upconverter stage provides LO power which is rectified to produce a DC voltage to power the LNA. Furthermore, power harvesting may be used in combination with a power splitter 44. In one example, the input of the power harvester 43 may connect to a two way splitter, which may have symmetry or asymmetry of power splitter powers. The splitter may take the form of a Wilkinson splitter, or directional coupler, to provide isolation between the two split parts of the LO signal.

Figure 4:
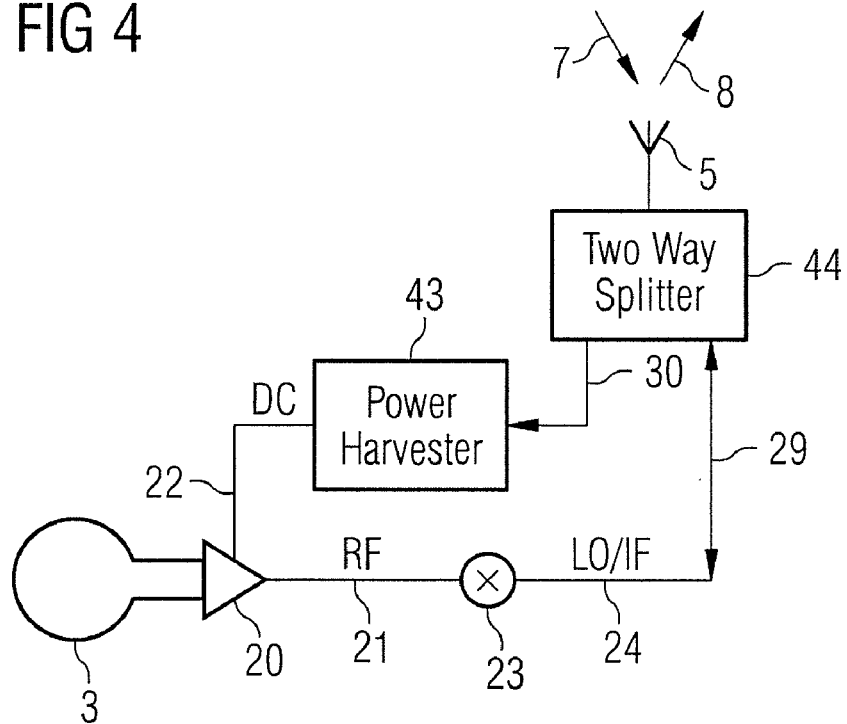
FIG. 4 illustrates a power harvesting upconverter according to the present invention.

A suitable circuit to achieve this is illustrated in FIG. 4. A feed 29 from the antenna 5 is connected to the mixer LO/IF port 24 via a two way splitter 44 that may be implemented, for example, either as a Wilkinson coupler or as a directional coupler as known to those versed in the art. The coupler 44 provides isolation of the path 29 between the antenna and the LO/IF port from a second path 30 that connects to a power harvester 43 containing a rectifier to provide DC suitable for powering the amplifier 20. In this way, the upconverter circuit is completely powered by the local oscillator power that is incident on the microwave antenna 5.

In this way, the present invention is able to harvest some DC power from the local oscillator to provide the necessary power for the amplifier. The power harvesting circuit 43 typically takes the form of a rectifier and a reservoir circuit, e.g. a capacitor, described in more detail hereinafter, arranged to obtain DC voltage, the circuit having a suitable voltage and current capability to power the low noise amplifier.

Figure 5A:
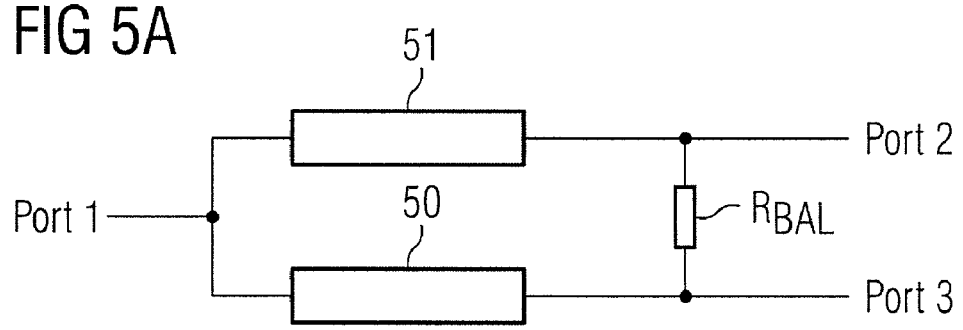
FIG. 5a illustrates a symmetric power splitter.
Figure 5B:
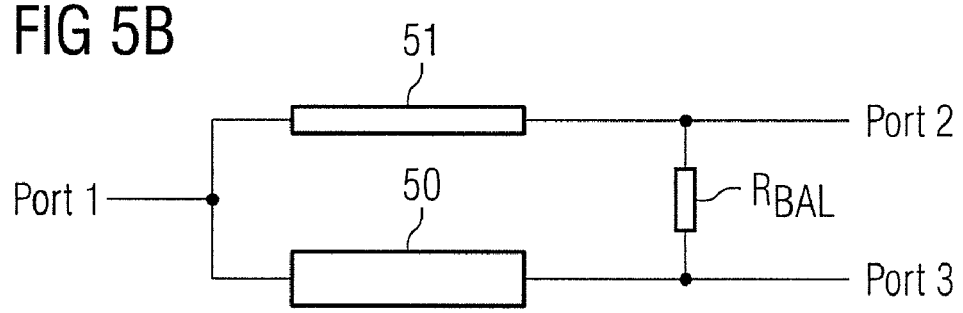
FIG. 5b illustrates an asymmetric power splitter.

Different types of power splitter 44 may be used. FIGS. 5A and 5B show simplified forms illustrating the operation of the power splitter. FIG. 5A illustrates a Wilkinson splitter. P1 sees an impedance of 50Ω. The signal splits equally through quarter wavelength lines 50, 51 at an impedance of approximately 72Ω. A balancing resistor at 100Ω is connected between P2 and P3. This arrangement gives a perfect match P1, if and only if, P2 and P3 are terminated in 50Ω. The arrangement presents a perfect match at P2 and P3, if and only if, P1 is terminated. The power incident on P1 is divided to give −3 dB at P2 and P3. FIG. 4 illustrates a pair of asymmetric Wilkinson splitters, each having two ¼ wavelength tracks of different width. Port P1 is equivalent to the microwave port 34 and ports P2 and P3 are connections to the parametric amplifier 35 and rectifier 43 respectively.

Figure 6A:
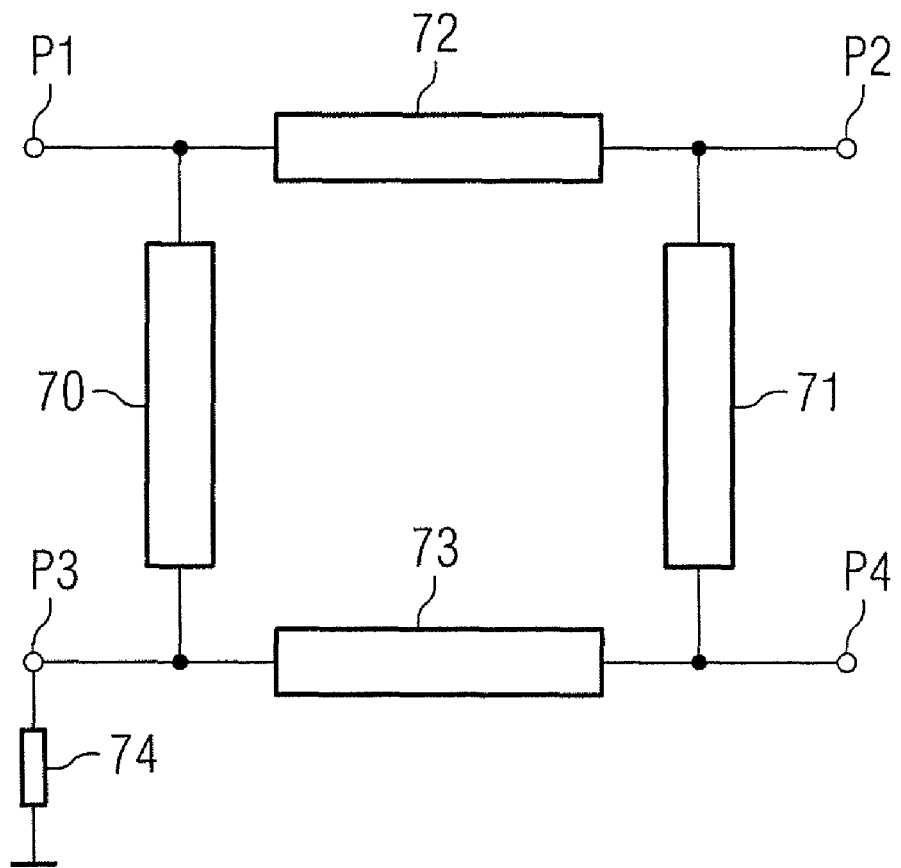
FIG. 6a illustrates a quadrature hybrid branch line splitter.
Figure 6B:
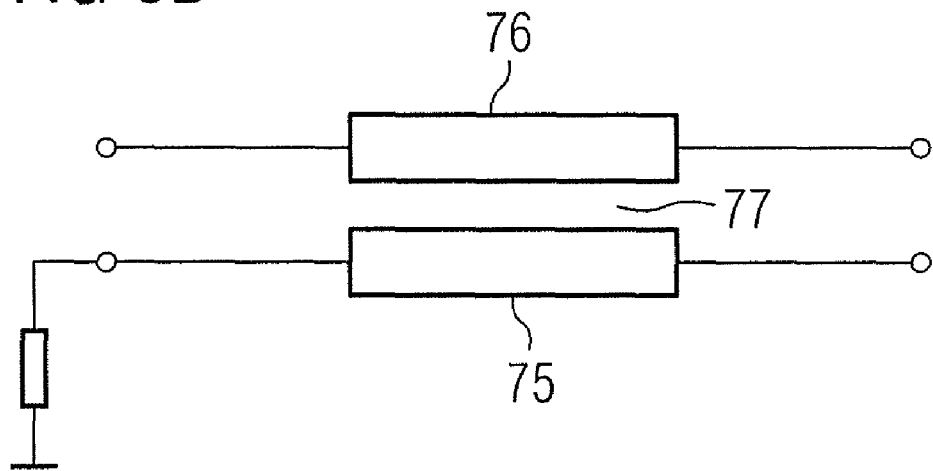
FIG. 6b illustrates an edge coupler.

In general, power is split equally between P2 and P3, but the requirements of the present invention are for an asymmetric structure, such as shown in FIG. 5B, giving rise to only a small part of the power going to the power harvester 43 and most of the power going to the mixer 23. Other types of splitter include directional couplers, for example, either branch line or edge couplers. The branch line coupler of FIG. 6A is a quadrature hybrid, where pairs 70, 71; 72, 73 of the same impedance are arranged to get power in at P1, dividing between P2 and P4, but with nothing out at P3, which is connected to ground. These are more difficult to manufacture than Wilkinson coupler's and as P3 is surplus to requirements, the couplers are also less compact. The edge coupler of FIG. 6B is made by printing two tracks 75, 76 very close together. This has 4 ports and one is connected to earth via a dump resistor. The required gap 77 between the tracks would be too small for existing manufacturing tolerances, as the ratio of track width to thickness of the dielectric determines the necessary spacing.

Figure 7:
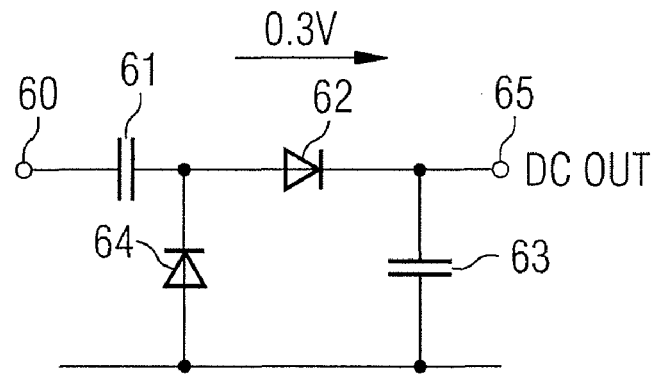
FIG. 7 illustrates a simple rectifier circuit for use as a power harvester in the device of FIG. 4.

The power harvester 43 may incorporate a resonant voltage transformation circuit and/or a Cockcroft-Walton voltage multiplier as necessary to obtain the required output voltage. FIG. 7 illustrates operation of an embodiment of a power harvester circuit suitable for the upconverter of the present invention. An input signal 60 sees a low impedance at RF frequency (e.g. 2.4 GHz) in capacitor 61, which may be a 100 pF capacitor, but this capacitor provides a block at DC. When the voltage goes high, diode 62 starts to conduct, takes current and puts charge onto the upper plate of the other capacitor 63. When the voltage goes low, the first diode 62 is reverse bias and the other diode 64 is forward biased. This restores charge to the first capacitor 61. Over time, the effect is to produce a DC output at 65.

Figure 8:
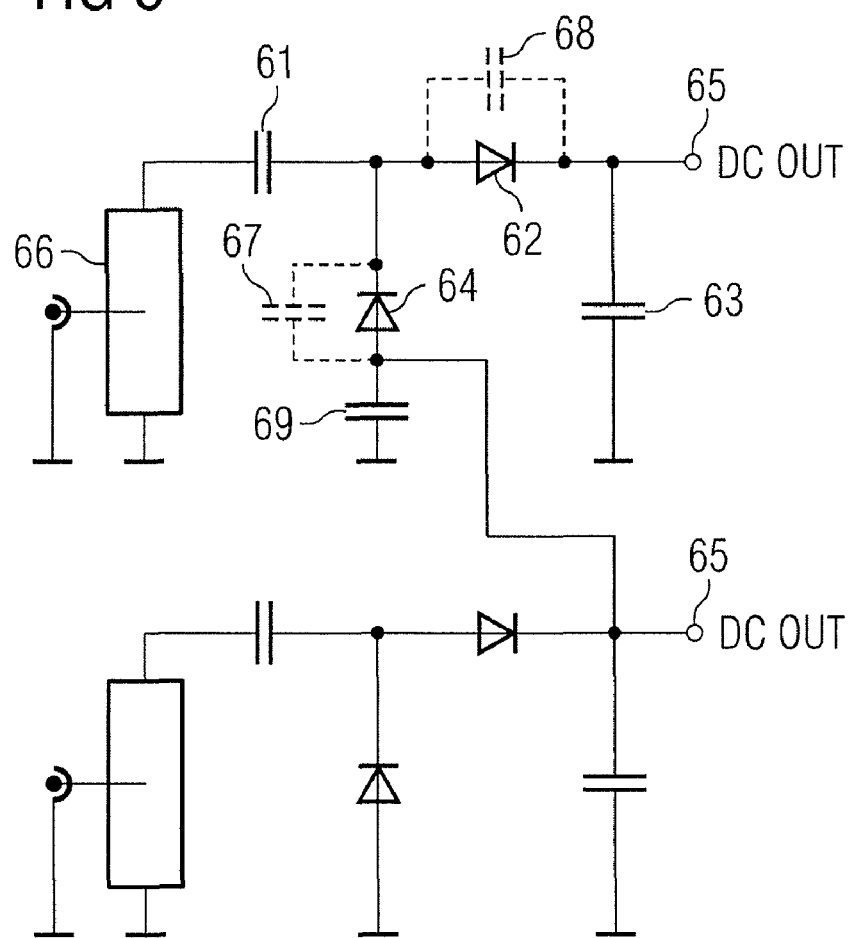
FIG. 8 shows an alternative example of a rectifier circuit for use as a power harvester in the device of FIG. 4.

An alternative implementation is shown in the example of FIG. 8, using a pair of rectifier circuits with a ¼ wavelength line 66. By tapping into the line 66 low down, the line resonates to increase the amplitude of the signal coming out to capacitor 61, so increasing the available voltage from the local oscillator, before rectifying the RF signal to generate the DC voltage. Due to parasitic capacitances 67, 68 of the diodes 64, 62, the required line is actually less than ¼ wavelength. The rectifier is tuned to 2.44 GHz and the available voltage is further increased by adding two outputs 65 together, using another capacitor 69 in the middle line, effectively acting as new ground, to get twice the voltage out at the same current.

Although modifications and changes may be suggested by those skilled in the art, it is the intention of the inventors to embody within the patent warranted hereon all changes and modifications as reasonably and properly come within the scope of their contribution to the art.

We claim as our invention:

1. An upconverter comprising:
   a low noise amplifier;
   a two port mixer and an antenna;
   the two port mixer comprising a first port to receive from the low noise amplifier an amplified input signal to be upconverted and a second port to receive a local oscillator signal and to output the amplified, upconverted signal at upper and lower sideband frequencies;
   the low noise amplifier being coupled to the first port; and
   the antenna being coupled to the second port.

2. An upconverter according to claim 1, wherein the local oscillator signal has a frequency at least twice that of the input signal.

3. An upconverter according to claim 1, further comprising a power harvester for harvesting power from the local oscillator signal.

4. An upconverter according to claim 3, wherein the power harvester provides a DC voltage supply to the low noise amplifier.

5. An upconverter according to claim 3, wherein the power harvester includes a Cockcroft Walton multiplier.

6. An upconverter according to claim 3, wherein the power harvester includes an impedance circuit to increase the available RF voltage from the local oscillator prior to rectification to DC.

7. An upconverter according to claim 1, wherein the upconverter further comprises a power splitter coupled between the second port of the mixer and the antenna.

8. An upconverter according to claim 7, wherein the power splitter splits incident local oscillator power between two outputs, one output being connected to a power harvester and the other output being connected to the second port of the mixer.

9. An upconverter according to claim 7, wherein the power splitter comprises one of a directional coupler and a Wilkinson coupler.

10. An upconverter according to claim 1, wherein the first port is an RF port.

11. An upconverter according to claim 10, wherein the first port receives signals in the frequency range 20 MHz to 500 MHz.

12. An upconverter according to claim 1, wherein the second port is a microwave port.

13. An upconverter according to claim 12, wherein the second port receives signals in the frequency range 1 GHz to 5 GHz.

14. A wireless magnetic resonance imaging system comprising:
   a local oscillator and transceiver array mounted on or downstream of a bore tube of the system;
   a wireless local coil array and upconversion stage comprising a plurality of upconverters;
   each of said upconverters comprising a low noise amplifier, a two port mixer and an antenna, the two port mixer comprising a first port to receive from the low noise amplifier an amplified input signal to be upconverted and a second port to receive a local oscillator signal and to output the amplified, upconverted signal at upper and lower sideband frequencies, the low noise amplifier being coupled to the first port, and the antenna being coupled to the second port.

* * * * *